United States Patent [19]

Higgins, Jr.

[11] Patent Number: 5,039,965

[45] Date of Patent: Aug. 13, 1991

[54] RADIO FREQUENCY FILTER FEEDTHROUGH STRUCTURE FOR MULTILAYER CIRCUIT BOARDS

[75] Inventor: Robert J. Higgins, Jr., Sunrise, Fla.

[73] Assignee: Motorola, Inc., Schaumburg, Ill.

[21] Appl. No.: 572,072

[22] Filed: Aug. 24, 1990

[51] Int. Cl.$^5$ .............................................. H03H 7/00
[52] U.S. Cl. .................................... 333/182; 333/184; 333/185; 361/414
[58] Field of Search .................. 333/12, 176, 181–185, 333/246; 439/607–610; 361/395, 412, 414, 424, 321

[56] References Cited

U.S. PATENT DOCUMENTS

| | | | |
|---|---|---|---|
| 3,538,464 | 11/1970 | Walsh | 333/182 |
| 4,144,509 | 3/1979 | Boutros | 333/185 X |
| 4,614,925 | 9/1986 | Kane | 333/184 X |
| 4,864,722 | 9/1989 | Lazzarini et al. | 361/414 X |
| 4,868,980 | 9/1989 | Miller, Jr. | 361/412 X |
| 4,945,323 | 7/1990 | Gerstenberg et al. | 333/185 |
| 4,945,399 | 7/1990 | Brown et al. | 357/74 |
| 4,950,185 | 8/1990 | Boutros | 333/183 X |
| 4,954,877 | 9/1990 | Nakanishi et al. | 357/80 |

Primary Examiner—Eugene R. LaRoche
Assistant Examiner—Seung Ham
Attorney, Agent, or Firm—Daniel K. Nichols

[57] ABSTRACT

A multilayer circuit board (200) providing a feedthrough filter having metallized via (234) having input and output ports (232, 226) which are coupled to metallized areas (206, 214). Each of the metallized areas (206, 214) being opposed by ground planes (202, 210, and 218) which are separated from the metallized areas (206, 214) by dielectric layers (204, 208, 212, and 216) forming a reactive coupling between the metallized areas (206, 214) and the ground planes (202, 210, and 218). The multilayer circuit board as employed in the present invention, may be advantageously utilized in a variety of applications where multilayer circuit boards require attenuation of unwanted RF signals.

7 Claims, 4 Drawing Sheets

RADIO FREQUENCY FILTER FEEDTHROUGH STRUCTURE FOR MULTILAYER CIRCUIT BOARDS

TECHNICAL FIELD

This invention relates generally to feedthrough filters, and in particular to multilayer circuit boards which provide feedthrough filters for the purpose of minimizing radio frequency interference.

BACKGROUND

Many present day electronic designs, especially those found in radios, offer different methods of shielding and attenuating circuitry from harmful radio frequency interference. Radio frequency signals can cause severe problems in different types of circuits especially those found in modern day radios. One of the most common methods of attenuating undesired radio frequency interference in electronic circuits is by designing the electronic circuit in a modular format, with most of the sensitive sections designed in their own shielded electronic modules. An example of this would be the circuits found in radios (i.e. the voltage controlled oscillator section, synthesizer, etc.) where each section of the radio is designed and placed in its shielded module. Other methods to shield circuitry from radio frequency interference that are employed in the art include: the use of filters such as ceramic feedthrough filters, multi-layered chip capacitors, employing ground planes in multilayer circuit boards wherever possible to minimize radio frequency (RF) interference, and use of shielded housings around RF critical circuitry.

The above mentioned methods for attenuating radio interference from electronic circuitry are fairly effective. The major problem with the above mentioned methods are that they normally require additional electronic parts to implement; as in the case of the use of conventional ceramic feedthrough filters, or multilayer chip capacitors. In the case of the shielded module design, radio frequency signals can sometimes still interfere with low frequency input signal lines going into the module (i.e. VCO input line). Any undesired radio frequency interference signal that gets coupled onto an input/output line connected to a module reduces the effectiveness of the shielding of the modular structure, and thus reduces the performance of the particular circuit. Therefore, there is a need in the art for a way of further shielding sensitive multilayer electronic circuitry from harmful radio frequency signals, without having to use extra electronic components.

SUMMARY OF THE INVENTION

Briefly, according to the invention, a multilayer circuit board provides a feedthrough filter, by using the different layers of the circuit board to form a filter. The filter is designed by using the multiple layers of the circuit board to sandwich different layers of metallized areas between opposed ground planes; the ground planes and metallized areas being located in separate layers of the multilayer circuit board. The ground planes are separated from the metallized areas by layers of dielectric material between the ground planes and metallized areas. The metallized areas are coupled to the metallized via, which has input and output sides. The metallized areas can be designed in such a way as to form reactive elements such as capacitors, inductors, and transmission lines. By forming different metallized areas in the multilayer board, a filter can be created which will attenuate unwanted radio frequency signals that get coupled to the input port (side) of the metallized via. In this way, any unwanted radio frequency signals that get coupled to the input port are attenuated before reaching the output port (side). The amount of attenuation achieved by the filter is dependent upon the characteristics of the filter designed. The output side of the via can terminate anywhere in the multiple layer circuit board (i.e. any of the layers, or on the other side of the circuit board). At least three metallized areas (or layers) separated by two dielectric layers are required in the multilayer circuit board to form a filter. Two metallized layers are required to form the ground planes, and one metallized layer is required to form the metallized surface (or area) which is sandwiched between the ground planes to form a reactive coupling between the metallized surface and the ground planes.

In another aspect of the present invention, a plurality of layers of the multilayer circuit board can be used to add more filter elements to the filter design (i.e. capacitors, inductors, transmission lines). In this way, different types of filters can be formed such as low-pass, band-pass, and band-stop filters depending on how the metallized layers are implemented.

DETAILED DESCRIPTION OF THE PREFERRED EMBODIMENT

Figure 1:
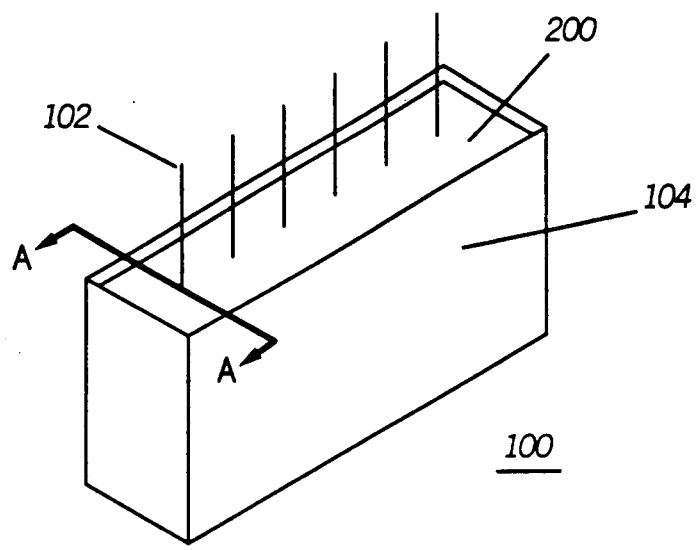
FIG. 1 is a diagram of a voltage controlled oscillator (VCO) module having a multilayer circuit board utilizing a feedthrough filter in accordance with the present invention.

Referring to FIG. 1, an electronic voltage controlled oscillator (VCO) module 100 embodying the present invention is shown comprising outside metal housing 104 having five sides, and input pin 102 which is coupled to multilayer circuit board 200.

Figure 2:
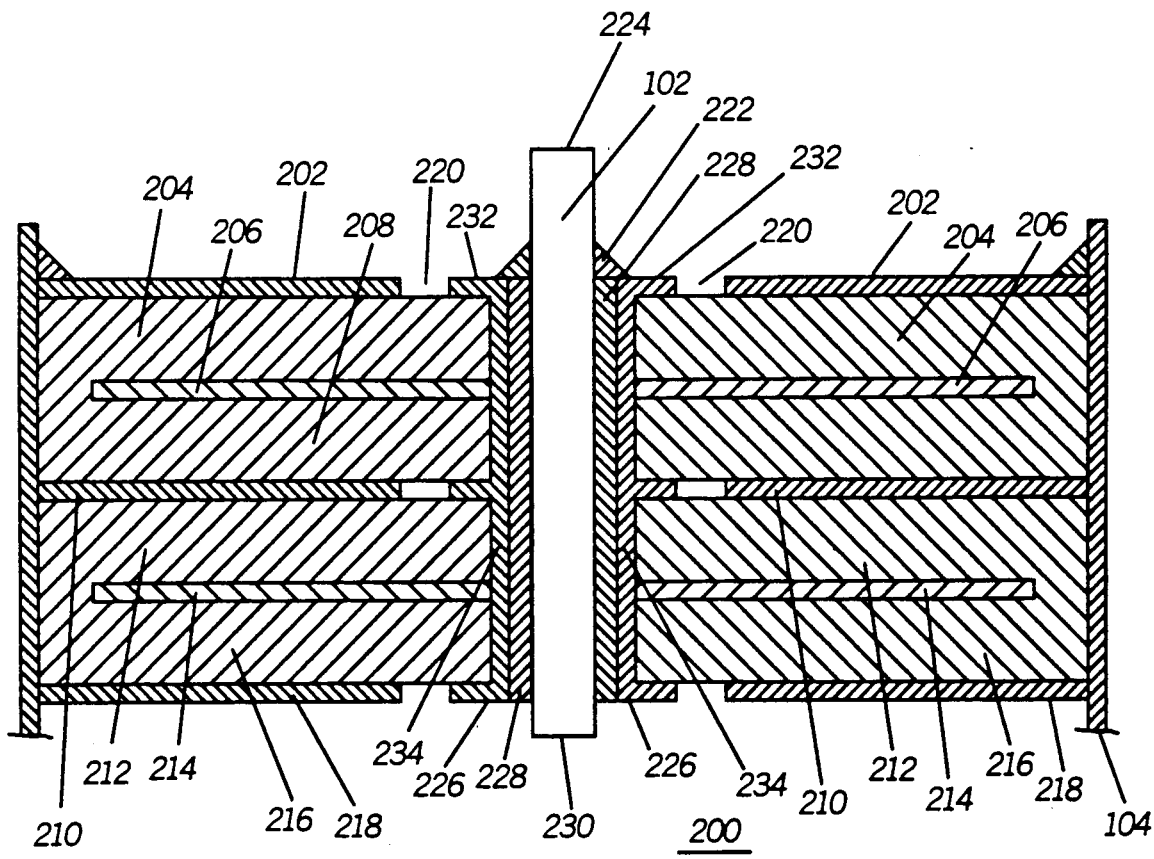
FIG. 2 is a diagram illustrating a partial cross-sectional view of FIG. 1 taken at line A—A.

FIG. 2 shows a cross-sectional view of FIG. 1 taken at line A—A. The electronic module 100 comprises a multilayer circuit board 200 having five layers, which is shown connected to pin 102 having, input port (or side) 224 and output port (or side) 230, and surrounded by outside metal housing 104, which in the preferred embodiment is grounded. Although a multilayer circuit board 200 having five layers is shown in FIG. 2, it will be apparent to those skilled in the art that any number of layers can be employed, preferably three or more layers. The word layers is used to refer to metallized layers, which are layers having metal film on one or more sides, such as the ground planes, and metallized areas. Pin 102 is coupled to the multilayer circuit board 200 by a metallized via 234 having input port (or side) 232 and output port (or side) 226. Pin 102 is electrically connected to multilayer circuit board 200 by solder cap 222 and solder 228 which resides between the metallized via and pin 102. Opposed ground planes 202, 210, and 218 are electrically connected to the outside metal housing 104 and are separated from the metallized via 234 by nonconductive separations 220 which in the preferred embodiment have a distance of 0.020 inches radially around the via. Metallized areas 206 and 214 are coupled to the metallized via 234 and are separated from the ground planes 202, 210 and 218 by dielectric layers 204, 208, 212, and 216.

The dielectric layers 204, 208, and 212 of the circuit board are preferably made out of common FR4 fire retardant glass epoxy material which has a dielectric constant of approximately 4.5, although it will be understood that any dielectric material having a dielectric constant greater than one could be utilized. Each of the dielectric layers (204, 208, 212, and 216) have a preferred thickness of 0.005 inches between the ground planes (202, 210, 218) and the metallized areas (206, and 214). The metallized areas 206 and 214 create reactance elements (i.e. capacitors, inductors, and/or transmission lines) which are coupled between the metallized areas 206 and 214, and ground planes 202, 210, and 218. Preferably, the metallized areas 206 and 214 are approximately 0.05 square inches in area. Since the metallized areas (206 and 214) are coupled to via 234, a feedthrough filter is formed between the input port 224, and output port 230 which is located inside metal housing 104. Depending on the specific design of the metallized areas 206 and 214, any unwanted radio frequency signals present on input port 224 will be attenuated. The characteristics of the reactance "elements" (capacitors, inductors, or transmission lines) that are created by the metallized areas 206 and 214, located between the ground planes 202, 210, and 218, depend mainly on the design of the metallized area surface. This will in turn determine the attenuation versus frequency characteristic of the filter.

While FIG. 2 shows a five layer circuit board, the minimum structure for any feedthrough filter structure as defined by the present invention would require at least one metallized area 206 coupled to a metallized via 234 and two ground planes 202 and 210. Thus, at least a three layer circuit board would be required in order to implement the minimum structure. Metallized area, 206, preferably forms a capacitive coupling between the metallized area 206, and ground planes 202 and 210. Those skilled in the art will appreciate that the greater the number of layers available for use in forming the feedthrough filter, the greater the number of reactive elements one can form using the present invention.

Thus, by creating feedthrough filter structures within the layers of a circuit board, one can attenuate radio frequency signals that become coupled to the input side of the circuit (i.e. input port 224 of pin 102, or input port 232 of metallized via 234) and avoid any interference with circuitry at the output side (i.e. output port 230 of pin 102, or output port 226 of metallized via 234). Those skilled in the art will appreciate that the present invention can be implemented having the input and output sides of the feedthrough filter structure in inner layers of a multilayer circuit board structure, which will provide the same attenuation function with no additional parts being employed.

Figure 3:
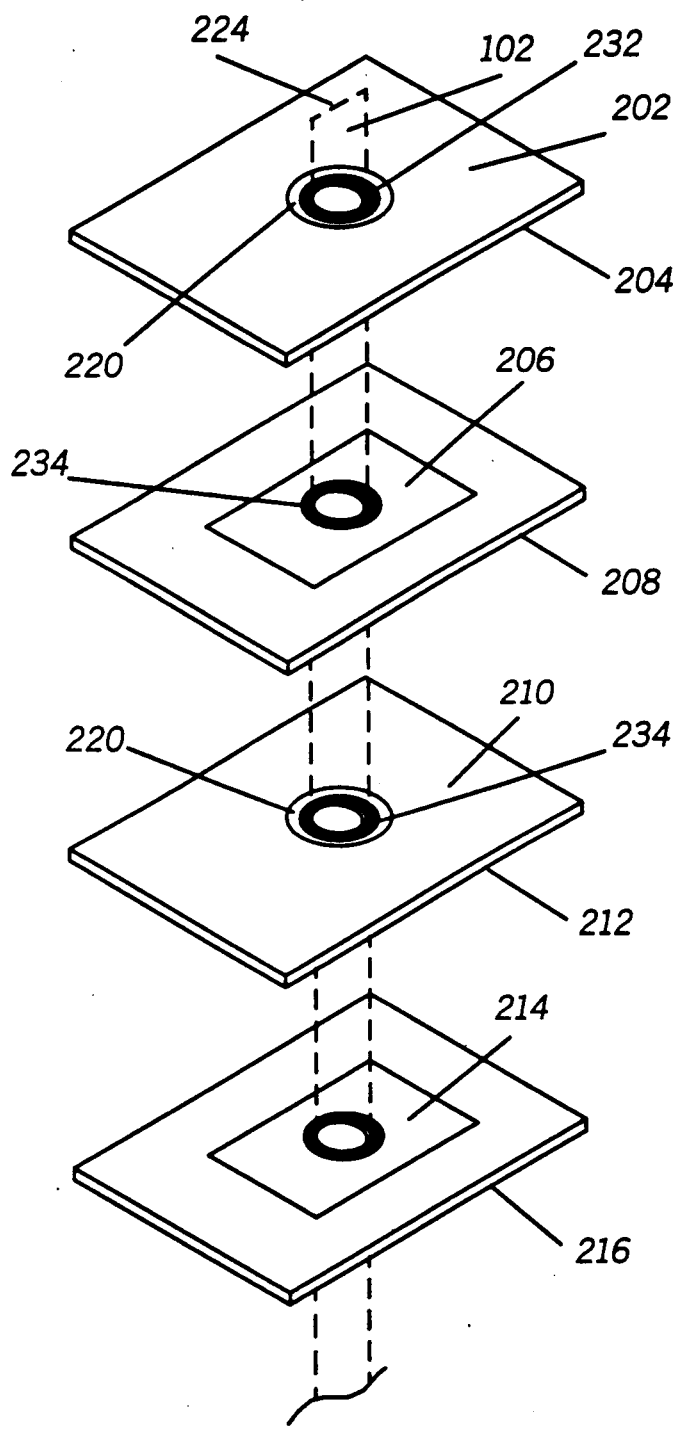
FIG. 3 is a partial exploded view of FIG. 2.

Referring to FIG. 3, a partial exploded view of FIG. 2 is shown in accordance with the present invention. FIG. 3 shows some of the five different layers of the multilayer circuit board 200 exploded away from each other for illustrative purposes. It will be understood by one skilled in the art, that any number of layers above three can be used in order to practice the present invention. The more layers employed in the design, the more reactive elements can be formed, and thus greater attenuation levels and different types of feedthrough filters can be achieved. Pin 102 is shown going through several of the layers of the multilayer circuit board 200. Ground planes 202 and 210 are shown separated from input port 232 and via 234 respectively by nonconductive separations 220. Metallized areas 206 and 214 are connected to the via 234, thus creating in this case a capacitive reactance between metallized area 206 and the ground planes 202 and 210, and a capacitive coupling between metallized plane 214, and ground planes 210 and 218 (not shown in FIG. 3). The capacitive reactance will attenuate unwanted RF signals may be coupled to via 234 from the outside of module 100.

Figure 4A:
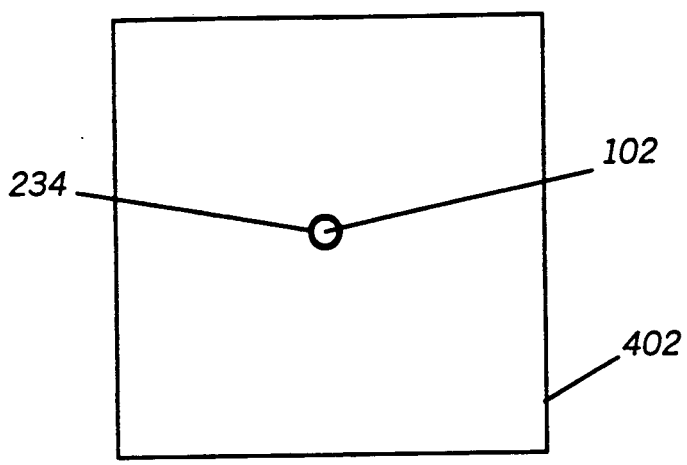
FIG. 4a is a top view of a metallized area (or layer) in accordance with the present invention.

FIG.'S 4a, 4b, and 4c, show different designs for the metallized area 206 and 214, with each of the designs creating different reactive characteristics. FIG. 4a shows the top view of a metallized surface (or area) 402 which is shown coupled to pin 102 and via 234. The arrangement of FIG. 4a when placed between opposed ground planes, creates a capacitance between the metallized area 402 a metallized plane in this case, and the opposed ground planes. The amount of capacitance created depends mainly on the area of the metallized surface 402, the distance the metallized surface and the ground planes, and the dielectric constant of the material that lies between the ground plane and the metallized surface 402. The capacitance will create a substantially low pass frequency response characteristic attenuating any unwanted radio frequencies that become coupled to the metallized via 234 (i.e. through input port 224 of pin 102). One skilled in the art will appreciate that in order to lower the cut off frequency of this type of feedthrough filter; the area of metallized surface 402 can be increased, the multilayer circuit board can be designed using a material with higher dielectric constant, the thickness of the dielectric layers can be reduced, or the number of capacitive elements can be increased by forming more metal and ground layers, thus increasing the number of layers in the multilayer circuit board.

Figure 4B:
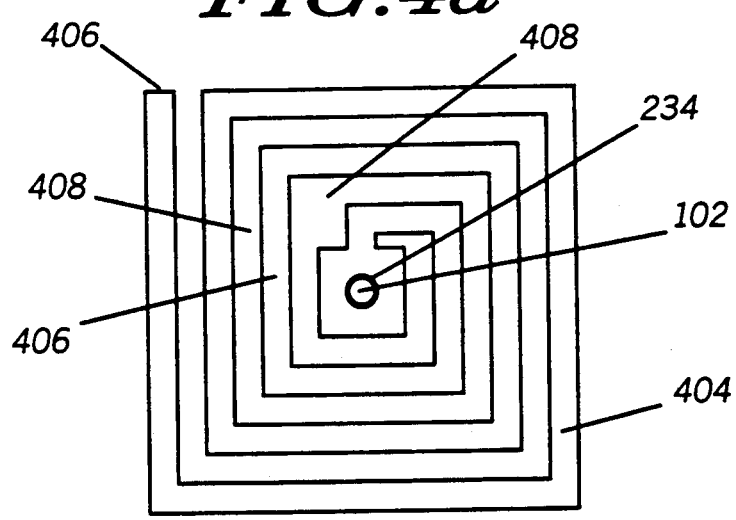
FIG. 4b is a top view of an alternate metallized area in accordance with the present invention.

FIG. 4b illustrates an alternate metallized surface (or area) 404 with one end of the metallized surface 404 coupled to pin 102 by via 234. The design of the metallized surface 404 is such that a reactive element is formed comprised of both capacitance and inductance elements between the metallized plane 404 and any adjoining ground planes. Metallized surface 404 has a spiral form around via 234 with each turn of the metallized surface isolated from the others by an insulating surface 408. The end of the metallized surface 406 is left "open" or not connected. The amount of reactance (inductance and capacitance) produced depends mainly on the length of the metallized surface 404 between the end which is coupled to metallized via 102 and the open end 406, the amount of distance between the subsequent turns of the metallized surface 404 are from each other, the spacing between metallized surface 404 and the ground planes above and below metallized surface 404, and the dielectric constant of the material separating surface 404 and the ground planes. By creating a substantially quarter wavelength metallized surface 404 a substantially bandstop filter characteristic can be developed. By creating a half wavelength metallized surface 404 a substantially bandpass filter structure will be formed (the circuit equivalent would be a capacitor and inductor in parallel between the metallized plane and the ground planes). The spiral metallized surface will act similar to a small transmission line structure within the circuit board in both cases.

Figure 4C:
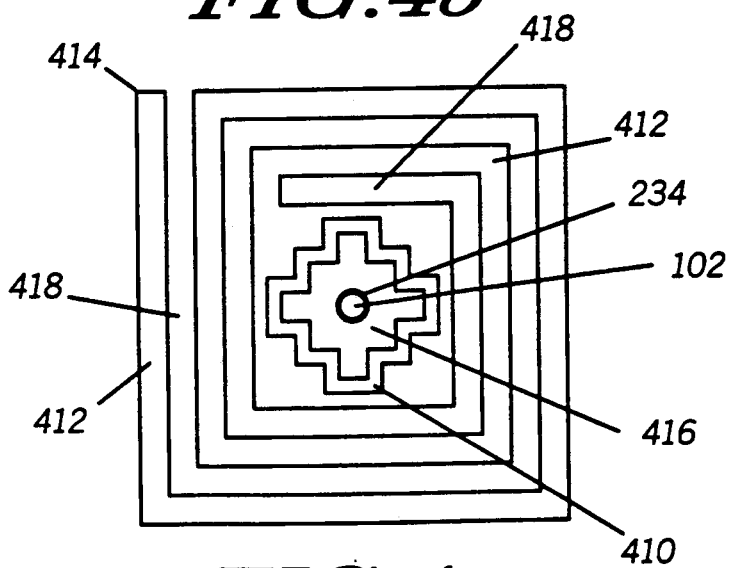
FIG. 4c is a top view of a second alternate metallized area in accordance with the present invention.

FIG. 4c which shows a second alternate metallized surface (or area) with a first portion or inner metallized area 416 coupled to pin 102 through metallized via 234, and a second portion or outside metallized area 412 separated from inner metallized plane 416 by a nonconductive surface 410. The outside spiral metallized area 412 terminates at end surface 414 which can be open or grounded. The structure shown in FIG. 4c forms a substantially coplanar series capacitive coupling between the via 234 and the coplanar spiral metallized area 412. With end surface 414 grounded, and by making the metallized spiral surface 412 substantially quarter wavelength a substantially bandstop filter is formed between the metallized via 234 and the ground planes.

Figure 5:
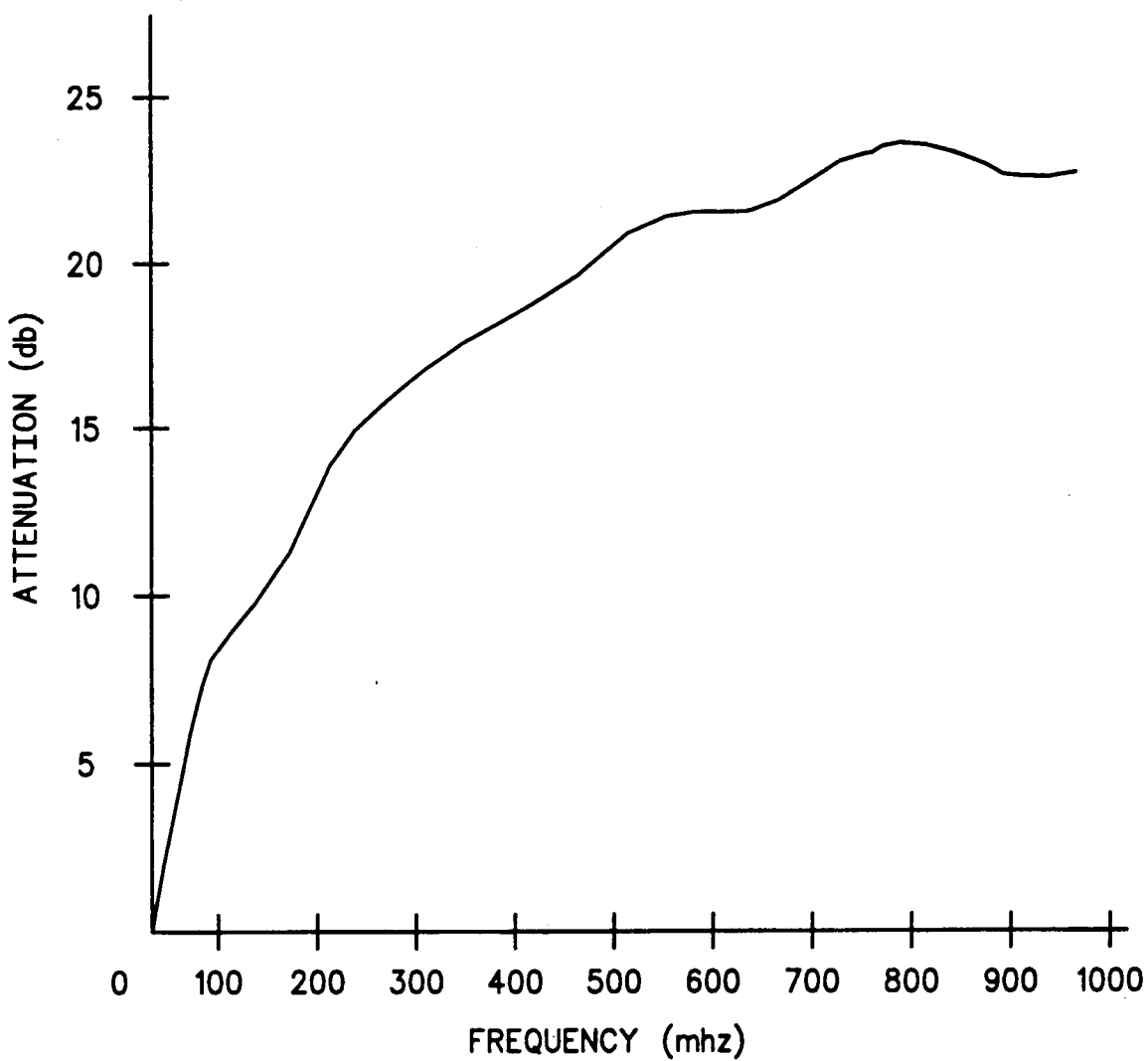
FIG. 5 is a diagram illustrating an attenuation versus frequency graph.

FIG. 5 shows a graph of the attenuation levels achieved at different frequencies by using a seven layer multilayer circuit board embodying the present invention. The attenuation levels were achieved in a VCO module located inside a 900 Mhz radio employing the present invention. The present invention was able to achieve attenuation levels in the range of 20 to 23 db around the 900 Mhz frequency range.

While a specific embodiment of this invention has been described above, further modifications and improvements will occur to those skilled in the art. Therefore, it should be understood that this invention is not limited to the particular form shown and that the appended claims are intended to cover all modifications which do not depart from the spirit and scope of this invention.

What is claimed is:

1. A multilayer circuit board having at least three layers providing a feedthrough filter, comprising:
   a metallized via providing input and output ports;
   a pair of opposed ground planes located about the metallized via on different layers of the multilayered circuit board; and
   a metallized area having a substantially spiral shape encircling the metallized via, located between the ground planes and coupled to the metallized via, with dielectric material filling the volume between the ground planes and the substantially spiral shaped metallized area for providing a reactive coupling between the metallized area and the ground planes, and further providing a feedthrough filter with substantially bandpass frequency response characteristics.

2. A multilayer circuit board providing a feedthrough filter as defined in claim 1, wherein the dielectric material is glass epoxy.

3. A multilayer circuit board having at least three layers providing a feedthrough filter, comprising:
   a metallized via providing input and output ports;
   a pair of opposed ground planes located about the metallized via on different layers of the multilayered circuit board; and
   a metallized area having a substantially spiral shape encircling the metallized via, located between the ground planes and coupled to the metallized via, with dielectric material filling the volume between the ground planes and the substantially spiral shaped metallized area for providing a reactive coupling between the metallized area and the ground planes and the substantially spiral shaped metallized area being substantially quarter wavelength in length, further providing a feedthrough filter with substantially bandstop frequency response characteristics.

4. A multilayer circuit board providing a feedthrough filter as defined in claim 2, wherein the substantially spiral shaped metallized area is substantially half wavelength in length, further providing a feedthrough filter with substantially bandpass frequency response characteristics.

5. A multilayer circuit board providing a feedthrough filter as defined in claim 4, further comprising:
   a grounded metal housing substantially surrounding the multilayer circuit board.

6. A multilayer circuit board having at least three layers providing a feedthrough filter, comprising:
   a metallized via providing input and output ports;
   a pair of opposed ground planes located about the metallized via on different layers of the multilayered circuit board; and
   a metallized area located between the ground planes having a first portion coupled to the via and a second portion having a substantially spiral shape separated from the first portion and encircling the metallized via forming a substantially series coplanar capacitive coupling between the first and second portions of the metallized area, with dielectric material filling the volume between the ground planes and the metallized area, and the substantially spiral shaped metallized area having a substantially quarter wavelength length for providing a reactive coupling between the metallized area and the ground planes, and further providing a feedthrough filter having a substantially bandstop frequency response characteristic.

7. A multilayer circuit board having at least three layers as defined in claim 6, wherein the substantially spiral shaped metallized area is grounded at its end surface.

* * * * *